United States Patent [19]

Tate et al.

[11] 4,375,660

[45] Mar. 1, 1983

[54] GROUND ISOLATION MONITORING APPARATUS HAVING A PROTECTIVE CIRCUIT

[75] Inventors: Stanley H. Tate, Portland; Donald K. Roberts, Beaverton; Carl E. Hollingsworth; William R. Nute, both of Portland, all of Oreg.

[73] Assignee: Tektronix, Inc., Beaverton, Oreg.

[21] Appl. No.: 230,997

[22] Filed: Feb. 3, 1981

[51] Int. Cl.³ ............................................. H02H 3/14
[52] U.S. Cl. ........................................ 361/50; 361/42; 361/49
[58] Field of Search ...................... 361/50, 49, 48, 47, 361/42; 324/51, 52; 340/649, 650, 651

[56] References Cited

U.S. PATENT DOCUMENTS

| | | | |
|---|---|---|---|
| 2,554,598 | 5/1951 | Storch | 361/50 |
| 2,999,189 | 9/1961 | Gerrard | 361/50 |
| 3,168,682 | 2/1965 | Moore et al. | 361/50 |
| 3,665,252 | 5/1972 | Rogers, Sr. et al. | 361/50 |
| 4,068,276 | 1/1978 | Pintell | 361/50 X |

*Primary Examiner*—Patrick R. Salce
*Attorney, Agent, or Firm*—George T. Noe

[57] ABSTRACT

A ground isolation monitoring apparatus having a protective circuit is provided for use between an AC power source and a utilization device, such as an electronic instrument. The protective circuit permits operation of the utilization device with earth ground disconnected, automatically reconnecting earth ground if a hazardous voltage or current appears on device chassis or exposed metal parts. The protective circuit also monitors neutral-to-earth ground continuity and shuts off AC power to the utilization device if the ground path opens or if the impedance thereof increases. Various other features may be provided to ensure safe operation of the device.

16 Claims, 2 Drawing Figures

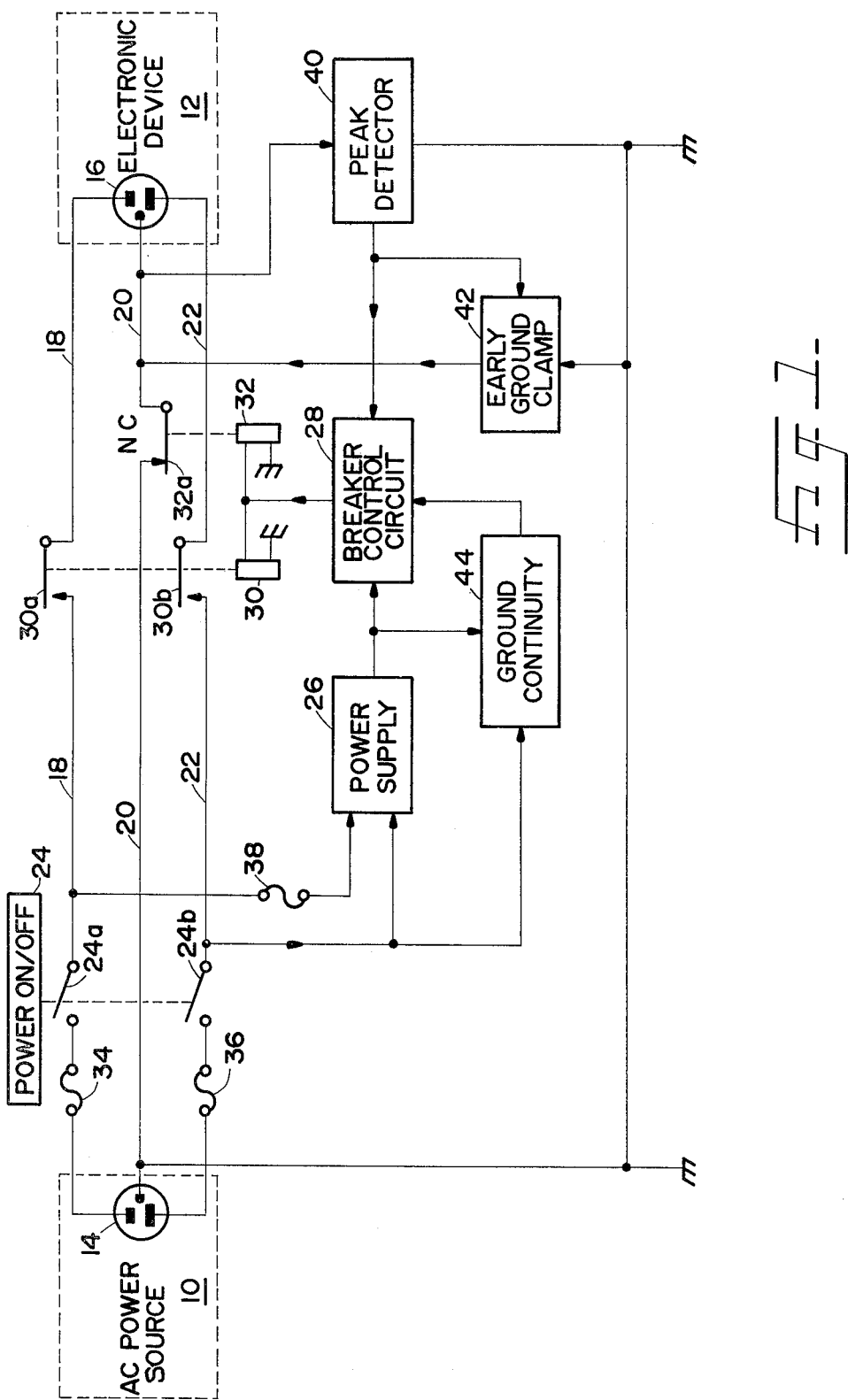

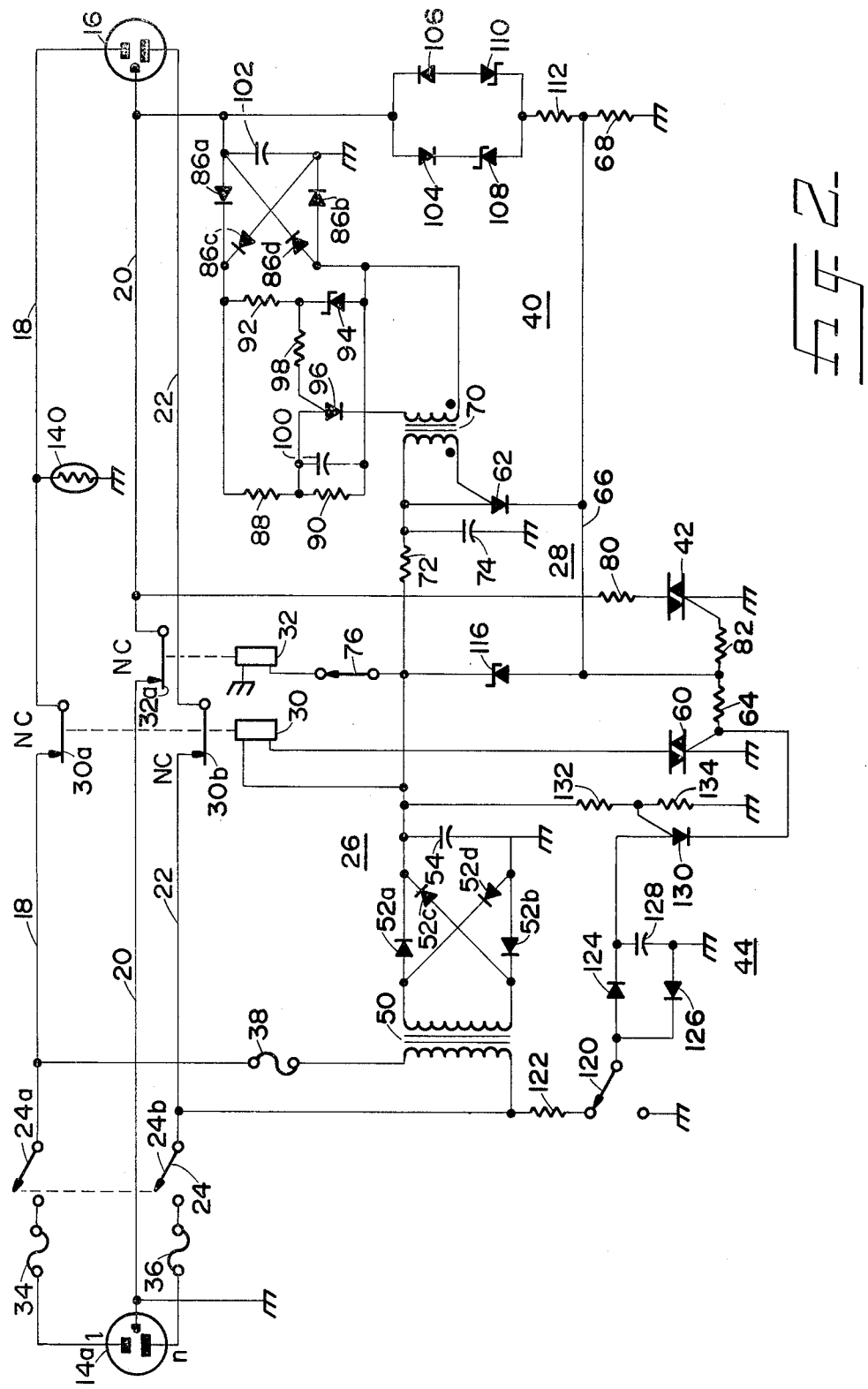

GROUND ISOLATION MONITORING APPARATUS HAVING A PROTECTIVE CIRCUIT

BACKGROUND OF THE INVENTION

This invention relates to a ground isolation monitoring apparatus for use between an AC power source and an electronic device operated with earth ground disconnected, and more particularly to such apparatus having a protective circuit which automatically reconnects earth ground and interrupts power to the device in the event that exposed conductive portions of the device become energized with hazardous potentials.

It is often desirable to operate certain electronic devices, such as test and measurement instruments, with the protective earth ground disconnected in order to facilitate so-called floating measurements. Floating measurements, i.e., measurements made without reference to ground, are common in situations in which small measurable signals are superimposed on large offsetting voltages which may exceed the input rating of the measuring device. It has been commonplace to insert an isolation transformer between the AC power source and the electronic device to permit floating measurements; however, it is recognized that this practice is often dangerous in terms of both shock hazard and equipment damage. Furthermore, worldwide safety standards have recently been imposed to provide safe working conditions, and therefore it is desired to provide a safe means of facilitating floating measurements.

SUMMARY OF THE INVENTION

In accordance with the present invention, a ground isolation monitoring apparatus having a protective circuit for use between an AC power source and an electrical or electronic device is provided. For normal operation, AC power passes through the apparatus and is applied to the device, while the associated protective earth ground is disconnected therefrom. facilitating floating measurements. A detector circuit monitors the earth ground connection of the device, and if a voltage or current exceeding predetermined limits is detected, earth ground is automatically reconnected to the device and AC power thereto is disconnected. The protective circuit in the monitoring apparatus may include other features, such as a high-speed switch to provide an early ground clamp, an audible alarm, excess line voltage protection, or operation test circuitry. Furthermore, for power systems in which one wire of a two-wire AC transmission line is neutral, the presence of a high-impedance neutral-to-ground path at the power source may be detected, indicating faulty ground continuity, and the portending hazard averted.

It is therefore one object of the present invention to provide a novel ground isolation monitoring apparatus having a protective circuit for use between an AC power source and an electronic device operated with earth ground disconnected.

It is another object of the invention to provide a ground isolation monitoring apparatus which automatically reconnects earth ground and interrupts power to an electronic device operated with earth ground disconnected in the event that exposed conductive portions of the device become energized with hazardous potentials or dangerous currents.

Other objects and advantages of the present invention will become apparent from the following description when taken in conjunction with the accompanying drawings.

BRIEF DESCRIPTION OF THE DRAWINGS

FIG. 1 is a block diagram of a ground isolation monitoring apparatus in accordance with the present invention; and FIG. 2 is a schematic diagram illustrating an exemplary embodiment of the protective circuits of a ground isolation monitoring apparatus.

DETAILED DESCRIPTION OF THE INVENTION

Turning now to the drawings, there is shown in FIG. 1 a block diagram of a ground isolation monitoring apparatus connected between an AC power source 10 and an electronic device 12, which may take the form of an electronic test and measurement instrument, such as an oscilloscope or the like. The monitoring apparatus comprises a three-conductor system including a plug assembly 14 for connection to the AC source, a receptacle assembly 16 for receiving an associated plug of the electronic device, a line or "hot side" conductor 18, an earth ground conductor 20, and a neutral conductor 20. The earth ground conductor 22 is connected to earth ground at the AC power source, and to the chassis or frame of the electronic device. When the contacts 24a and 24b of a power switch 24 are closed, AC power is applied to a power supply circuit 26, which generates a DC voltage for operation of the monitor apparatus circuits. A breaker control circuit 28 applies DC operating voltage to a pair of relays 30 and 32, which when activated close contacts 30a and 30b to apply AC power via conductors 18 and 22 to the electronic device, and open contact 32a, a normally closed contact, to disconnect earth ground from the electronic device.

Fuses 34 and 36 are provided for conductors 18 and 22 respectively to provide protection by opening in the event that the current through either of such fuses exceeds the fuse rating. Similarly, a fuse 38 is provided on the hot side of power supply 26. In any event, if any of the fuses blow, power supply 26 will shut off, removing power from relays 30 and 32, opening contacts 30a and 30b, and closing contact 32a.

Under operating conditions with AC power applied to the electronic device and earth ground disconnected by open contact 32a, a peak detector circuit 40, which is connected to the earth ground conductor 20, monitors the voltage and current level of the open ground connection at the output receptacle 16. If the voltage on the ground terminal of output receptacle 16 exceeds a predetermined safe level, or if a fault current flows, the peak detector 40 produces an output signal to the breaker control circuit 28 to remove power from the relays 30 and 32. With the power removed from relays 30 and 32, earth ground is reconnected via closed contact 32a and power is interrupted by the opening of contacts 30a and 30b. The output of the peak detector 40 is also applied to an early ground clamp circuit 42, which suitably comprises an electronic switch, to apply earth ground to the ground terminal of output receptacle 16 within microseconds of the fault detection. Thus, because the breaker shutdown via the breaker control circuit 28 and relay 32 may take a few milliseconds, earth ground is reapplied almost immediately via the early ground clamp 42. Also, the early ground clamp circuit 42 provides an additional safety feature by acting as a backup should contact 32a fail to close for some reason.

A ground continuity monitoring circuit 44 may also be provided for AC power systems in which one side of the line is neutral and connected to earth ground to detect the presence of a high-impedance neutral-to-ground path at the power source and to activate the breaker control circuit in the event a voltage in excess of a predetermined level appears on the neutral conductor 22, or if the impedance increases.

The details of the protective circuits of the ground isolation monitoring apparatus are shown in FIG. 2. Note that in this exemplary embodiment the contacts 30a and 30b are shown as normally closed (NC), illustrating that this detail may be a matter of design choice. In the embodiment built and tested, relay 30 along with contacts 30a and 30b comprise a magnetic circuit breaker which, when tripped, opens and remains so until manually reset. However, it is preferable that a normally closed contact 32a always be used to ensure application of earth ground at all times when it is not desired to float the device connected to the output receptacle 16.

The power supply 26 comprises a transformer 50, a four-diode bridge full-wave rectifier consisting of diodes 52a, 52b, and 52c, and 52d, and a filter capacitor 54. While a single primary winding is shown for transformer 50, a double winding and switching arrangement to facilitate 115 V/230 V operation could easily be implemented. In this exemplary embodiment, the power supply 26 produces about 30 volts DC.

The breaker control circuit 28 includes a first switch 60, which may take the form of any type of interruptable controllable switch such as a Triac, and a second switch 62, which may suitably be a programmable unijunction transistor. Under normal operating conditions, these switches are off; the gate of switch 60 is connected through a resistor 64 to a control line 66, to which the cathode of switch 62 is also connected, and control line 66 is in turn connected to ground through a resistor 68. The anode and gate of switch 62 are connected across the secondary winding of a transformer 70, which for the time being is not energized. The anode of switch 62 is also coupled to the power supply 26 through a resistor 72, which along with capacitor 74 forms a decoupling network to prevent inadvertent firing of the unijunction transistor switch due to power supply variations. One end of relay 30 is connected to the power supply 26, while the other end thereof is connected to the top of switch 60, which for the time being is open so that relay 30 is not grounded. Therefore, relay 30 is de-energized and AC power may be applied over conductors 18 and 22 via closed contacts 30a and 30b. Relay 32, one end of which is connected to ground, is energized, since the other end thereof is connected via closed switch 76 to the power supply 26. Thus, contact 32a is pulled open, disconnecting the output receptacle 16 from earth ground. Switch 76 may be opened to provide an operating mode of the monitoring apparatus whereby earth ground is always connected.

The early ground clamp switch 42, which also may take the form of any type of interruptable controllable switch such as a Triac, is connected from ground through a resistor 80 to the output side of earth ground conductor 20. This switch, which is normally closed, has a gate which is connected through a resistor 82 to the control line 66.

If the potential on control line 66 is moved away from ground, both switches 60 and 42 will fire, connecting ground to one end of relay 30 and to the output side of earth ground conductor 20. Relay 30 will then become energized, opening contacts 30a and 30b and hence interrupt the AC power being applied over conductors 18 and 22. As mentioned previously, once contacts 30a and 30b are opened, they remain open until the breaker is manually reset.

The peak detector 40 is designed to detect ground-fault current flow as well as voltages in excess of predetermined safe levels. A four-diode bridge full-wave rectifier consisting of diodes 86a, 86b, 86c, and 86d is connected to the earth ground terminal of the output receptacle 16 to detect either positive or negative voltages. A network comprising resistors 88, 90, and 92, and Zener diode 94 is connected across the output of the bridge rectifier. A switch 96, which may suitably be a programmable unijunction transistor, is serially connected between the junction of resistors 88 and 90 and one end of the primary winding of transformer 70, the other end of which is connected back to the junction of resistor 90, Zener diode 94, and the bridge rectifier. The gate of switch 96 is connected through a resistor 98 to the junction of resistor 92 and Zener diode 94. The network is designed so that if the peak voltage at the earth ground terminal of output receptacle 16 exceeds ±40 volts, or if a ground-fault current in excess of 0.5 milliampere flows, switch 96 fires, developing a pulse across transformer 70 which in turn fires switch 62 to thereby remove power from relay 32 and reconnect earth ground via contact 32a. Of course, when switch 62 fires, control line 66 is initially pulled up, firing switches 60 and 42 as previously described to apply the early ground clamp and interrupt AC power.

A fast peak detector comprising diodes 104 and 106, Zener diodes 108 and 110, and resistor 112 is connected between the earth ground terminal of output receptacle 16 and the control line 66 to fire switches 60 and 42 in the event that the peak voltage exceeds a safe limit of ±40 volts. The fast peak detector provides protection in a case in which a large hazardous voltage suddenly appears on conductive outer portions of the electronic device to which output receptacle 16 is connected so that earth ground may be reapplied and operating power interrupted before the normal peak detector and switch 62 react.

A Zener diode 116 is connected between the output of power supply 26 and control line 66 to provide protection from a line overvolts situation by activating switches 60 and 42.

The monitoring apparatus may also incorporate a ground continuity monitoring circuit 44, as discussed above in connection with FIG. 1. As mentioned hereinabove, this feature is provided for use with AC power systems in which one side of the line is neutral—if this is not the case, a switch 120 permits the ground continuity monitoring circuit to be disconnected. The ground continuity circuit comprises a voltage-sensing resistor 122, a peak detector circuit including diodes 124 and 126 and capacitor 128, and a switch 130, which may suitably be a programmable unijunction transistor, the gate electrode of which is connected to a voltage divider comprising resistors 132 and 134. If the neutral (n) is not connected to earth ground at the power source, as it should be, as soon as switch 24 is closed about one-half of the line potential will appear on the neutral wire due to hot-to-neutral wire capacitance. Capacitor 128 will charge to a positive voltage, causing switch 130 to fire, in turn firing switches 60 and 42, thereby removing power and reconnecting earth ground to the device connected to receptacle 16. Of course, if the neutral wire 22 is at ground potential when power is applied, switch 130 will not fire; however, the circuit will be available to monitor the neutral potential, and if a hazardous potential appears, switch 130 will fire.

Even though the neutral is connected to ground within the power source, the connection may be poor, and consequently there is a need to monitor the ground continuity. A thermistor 140 is connected between the hot side conductor 18 and earth ground. Before power is applied, thermistor 140 is cold, and, consequently, the resistance thereof is low, for example, about 35 ohms. When power is applied, current is forced through thermistor 140 to the earth ground conductor. If the ground impedance is greater than about five ohms, a voltage will be developed between neutral and ground which will be sensed by resistor 122, charging capacitor 128, and firing switch 130 as discussed in the preceding paragraph. If the ground impedance is less than five ohms, indicating a good ground continuity, thermistor 140 will heat up by the applied line voltage, causing the resistance thereof to increase, decreasing the current flow in the ground path to a low value, for example, about five milliamperes. In this condition, the monitoring continues because if the neutral-to-ground path opens, or if the resistance thereof increases, even the small amount of current supplied via thermistor 140 will be sufficient to develop a voltage that will be sensed by resistor 122 to activate switch 130.

While we have shown and described a preferred embodiment of our invention, it will be apparent to those skilled in the art that many changes and modifications may be made without departing from our invention in its broader aspects. Therefore the scope of the invention should only be determined by the following claims.

What we claim as being novel is:

1. An apparatus for monitoring an earth ground path between an AC power source and an electronic device, comprising:
   means for isolating a portion of said earth ground path from earth ground;
   detection means coupled to said isolated portion of said earth ground path for detecting a hazardous electrical condition thereon, said detection means comprising a full-wave rectifier and a pulse-generating circuit for developing a pulse when the voltage or current on said isolated portion of said earth ground path exceeds a predetermined value; and
   control circuit means comprising electronic switch means responsive to said pulse from said detection means for reconnecting earth ground to said isolated portion of said earth ground path.

2. An apparatus in accordance with claim 1 wherein said detection means further comprises a fast peak detector connected in parallel with said full-wave rectifier and said pulse generating circuit for operating said control circuit in response to rapidly occurring voltages on said isolated portion of said earth ground path.

3. An apparatus in accordance with claim 1 wherein said isolating means comprises an electrical relay having a contact disposed along said earth ground path, and control circuit means comprises means for energizing and de-energizing said relay.

4. An apparatus in accordance with claim 5 wherein said control circuit means further comprises an electronic switch connected between earth ground and said isolated portion of said earth ground path.

5. An apparatus in accordance with claim 4 wherein said control circuit means further comprises means for disconnecting said device from said AC power source.

6. An apparatus in accordance with claim 5 wherein said control circuit means further comprises means for detecting a line overvolts condition of said AC power source and disconnecting said device from said AC power source.

7. An apparatus in accordance with claim 6 wherein said line overvolts detecting means comprises a power supply to produce a DC voltage from said AC power source, and a Zener diode connected to the output of said power supply to activate said control circuit means if the Zener rating is reached.

8. An apparatus for monitoring an earth ground path between an AC power source and an electronic device, comprising:
   means for isolating a portion of said earth ground path from earth ground;
   detection means coupled to said isolated portion of said earth ground path for detecting a hazardous electrical condition thereon;
   control circuit means responsive to said detection means for reconnecting earth ground to said isolated portion of said earth ground path; and
   a ground continuity monitoring circuit connected between a neutral conductor of said AC power source and earth ground for detecting a voltage therebetween and producing an output if said voltage exceeds a predetermined value, said control circuit means further being responsive to the output of said ground continuity monitoring circuit for connecting said device to earth ground and at the same time disconnecting said device from said AC power source.

9. An apparatus in accordance with claim 8 wherein said ground continuity monitoring circuit comprises a voltage-sensing resistor, a peak detector, and an electronic switch.

10. An apparatus in accordance with claim 8 wherein said ground continuity circuit further comprises means for forcing current through the neutral-to-earth ground impedance path to monitor the continuity thereof.

11. A monitoring apparatus for use between an AC power source and a utilization device, comprising:
   interconnection means comprising a line conductor, a neutral conductor, and an earth ground conductor for electrically connecting and disconnecting said device to and from said AC power source;
   means for electrically isolating a portion of said earth ground conductor thereby to isolate said device from earth ground;
   ground-continuity circuit means comprising a voltage-sensing resistor, a peak detector, and an electronic switch for detecting a voltage between said neutral conductor and said earth ground conductor and activating said switch when said voltage exceeds a predetermined level;
   control circuit means coupled to said interconnection means and being responsive to the activation of said switch for disconnecting said device from said AC power source; and
   further detection means coupled to the isolated portion of said earth ground conductor for detecting a hazardous electrical condition thereon, said control means being responsive to said further detection means for reconnecting said device to earth ground.

12. A monitoring apparatus in accordance with claim 11 further comprising means connected between said line conductor and said earth ground conductor for forcing a current through the neutral-to-earth ground impedance path to monitor the continuity thereof.

13. A monitoring apparatus in accordance with claim 11 wherein said control circuit means comprises at least one electrical relay, the contacts of which are disposed along said conductors of said interconnection means, and means for energizing and de-energizing said relay.

14. A monitoring apparatus in accordance with claim 13 wherein said control circuit means further comprises an electronic switch disposed between said earth ground conductor and said isolated portion thereof.

15. A monitoring apparatus in accordance with claim 11 wherein said further detection means comprises a full-wave rectifier and means for generating a detection signal when the current or voltage on said isolated portion of said earth ground conductor exceeds predetermined values.

16. A monitoring apparatus in accordance with claim 15 wherein said further detection means further comprises a fast peak detector in parallel with said full-wave rectifier and detection signal generating means, said fast peak detector comprising the serial combination of a diode and a Zener diode.

* * * * *

UNITED STATES PATENT AND TRADEMARK OFFICE
CERTIFICATE OF CORRECTION

PATENT NO. : 4,375,660

DATED : March 1, 1983

INVENTOR(S) : STANLEY H. TATE et al.

It is certified that error appears in the above—identified patent and that said Letters Patent is hereby corrected as shown below:

Col. 6, line 1, reads "claim 5", it should read --claim 3--

Signed and Sealed this

Thirty-first Day of May 1983

[SEAL]

Attest:

DONALD J. QUIGG

Attesting Officer     Acting Commissioner of Patents and Trademarks